United States Patent [19]

Lieb

[11] 4,301,371
[45] Nov. 17, 1981

[54] HOLDING DEVICE FOR ELECTRON-MICROSCOPE SPECIMENS

[75] Inventor: Claude Lieb, Bad Ragaz, Switzerland

[73] Assignee: Balzers Aktiengesellschaft, Liechtenstein

[21] Appl. No.: 136,770

[22] Filed: Apr. 3, 1980

[30] Foreign Application Priority Data

Apr. 12, 1979 [CH] Switzerland ............ 3500/79

[51] Int. Cl.³ ............................................. G01M 21/00
[52] U.S. Cl. ...................................... 250/443; 250/311; 250/454
[58] Field of Search ................ 250/443, 449, 311, 454

[56] References Cited

U.S. PATENT DOCUMENTS 3,151,241  9/1964  Hermann et al. ............ 250/443
3,388,251  6/1968  Grasenick et al. .......... 250/443

FOREIGN PATENT DOCUMENTS 858925  1/1961  United Kingdom .

Primary Examiner—Harold A. Dixon
Attorney, Agent, or Firm—McGlew and Tuttle

[57] ABSTRACT

A holding device for electron-microscope specimens comprises a guide bar which is connected to an apparatus for controlling its temperature by heating or cooling it as necessary. The guide bar is mounted on a supporting block and it may be pressed into pressure interengagement therewith to provide a thermal contact therebetween or released. The supporting block has a clamping device for clamping a specimen thereto, which for example, comprises a spring member having forked shaped arms which engage around a specimen and hold it tightly to the supporting block.

7 Claims, 6 Drawing Figures

U.S. Patent
Nov. 17, 1981
4,301,371
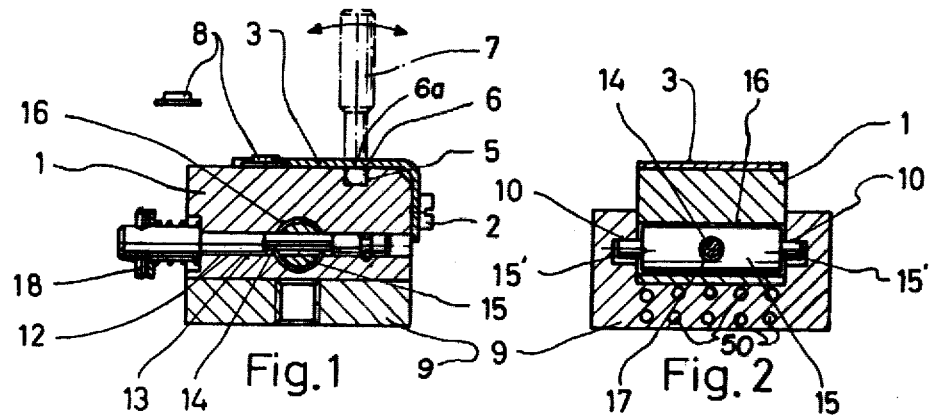
Fig. 1
Fig. 2
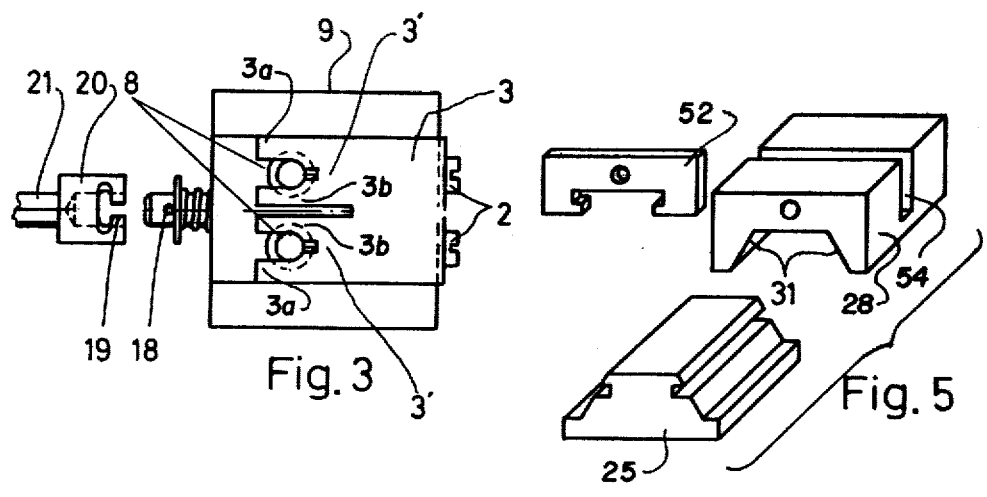
Fig. 3
Fig. 5
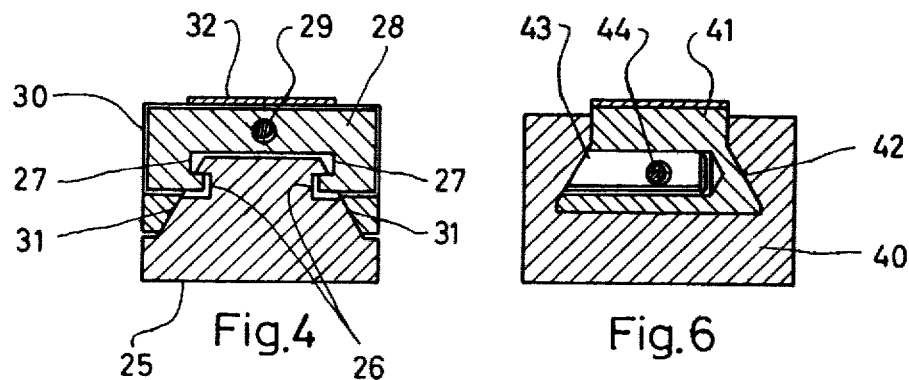
Fig. 4
Fig. 6

HOLDING DEVICE FOR ELECTRON-MICROSCOPE SPECIMENS

FIELD AND BACKGROUND OF THE INVENTION

The present invention relates in general to vacuum operations and in particular to a new and useful device for heating or cooling electron-microscopic specimens during a treatment, for example a vapor deposition accentuating contrasts for the subsequent electron-microscopic examination or to examine the specimen at different temperatures.

Specimens, particularly biological ones, are usually cooled during the vapor deposition, to prevent their overheating, or specimens such as metallurgical microsections are heated during the examination to be able to observe the phenomena occurring at higher temperatures. For this purpose, the specimen may be placed on a support whose temperature is adjustable, and then the problem to be solved is a reliable transfer of heat; this is particularly important with treatments in a vacuum chamber. That is, in this latter case, already minute gaps between the contacting surfaces of the specimen and the heatable or coolable support produce a disturbing effect, since through evacuated interstitial spaces, the temperature becomes equilibrated predominantly only by radiation, hardly any longer by heat conduction in the gas atmosphere of the vacuum. This may result in considerable temperature differences between the support and the specimen and in such instances the temperature of the support can no longer serve as a measure for the temperature of the specimen during the treatment or examination.

SUMMARY OF THE INVENTION

The present invention is directed to a heatable or coolable stage or support for electron-microscopic specimens comprising an easily exchangable supporting block with a specimen holding mechanism providing an arrangement ensuring a reliable thermal contact between the supporting block and the base carrying the block.

In accordance with the invention, the invention provides a guide bar associated with the supporting block, and a device for pressing the supporting block into contact with the guide bar, operable by means of an eccentric or similar mechanism.

Due to the eccentric, a constant contact pressure and thereby a well defined heat transfer from the bar whose temperature can be adjusted, to the supporting block is obtained; this also results in a substantially more reliable relation to the temperature of the specimen during the treatment or examination, as compared to that achievable with prior art devices. Preferably, the eccentric-operated contact-pressure device is accommodated in a cavity of the supporting block. The portion projecting from the supporting block of the shaft actuating the eccentric is advantageously a coupling element for connecting the device to an extension shaft, and this extension shaft may serve as a manipulator for introducing and withdrawing the supporting block into or from a treatment or observation chamber.

Accordingly, it is an object of the invention to provide a holding mechanism for electron-microscope specimens which comprises a side bar on which is supported a supporting block for the specimens and which contains means for selectively heating and cooling the guide bar to maintain it at a selected temperature and which also includes means for moving the supporting block and the guide bar relatively into pressure interengagement to provide a good thermal contact therebetween and out of pressure engagement for releasing the two.

A further object of the invention is to provide a device for holding electron-microscope specimens which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1 is a longitudinal sectional view parallel to the axis, of a first embodiment of the invention;

FIG. 2 is a sectional view perpendicular to that of FIG. 1;

FIG. 3 is a top plan view of a device according to FIGS. 1 and 2;

FIG. 4 is a view similar to FIG. 1 of a second embodiment of the invention;

FIG. 5 is an exploded perspective view of the three substantial parts of the device according to FIG. 4 and;

FIG. 6 is a sectional view of still another embodiment of the invention.

DESCRIPTION OF THE PREFERRED EMBODIMENTS

Referring to the drawings in particular the invention embodied therein in FIG. 1 comprises a holding device for electron-microscope specimens which includes a guide bar or base plate 9 which has means for controlling the temperature of the bar such as a plurality of tubes 50 through which a heating or cooling medium is circulated. A supporting block 1 is associated with the guide bar and may advantageously be mounted for sliding interengagement therewith. In addition, driver means are provided between the block 1 and the guide bar 9 for moving them relatively so as to press them into pressure interengagement and to provide a good thermal contact therebetween or to move them out of pressure interengagement so that they may be moved relatively or that one may be removed from the other.

FIGS. 1-3 show a supporting block 1 with a specimen holding mechanism generally designated which is secured thereto by means of screws 2 and comprises a spring leaf 3 of beryllium bronze having one or more, two in the example of FIG. 3, resilient tongues 3' with forked end portions. Supporting block 1 is provided with a groove 5 into which, thus between block 1 and spring leaf 3, a cylindrical driver 6 for actuating the holding mechanism can be introduced. The driver 6 has an even ground side face or flat 6a and is advantageously connected to a handle 7 by which, as indicated in FIG. 2, it can be pivoted in groove 5. FIG. 1 shows a driver in a position in which the even face 6a thereof is flush with the surface of the supporting block, so that spring leaf 3 applies thereto snugly. The specimens 8, over which the forks of the spring leaf are engaged, are pressed by the spring force into contact with the surface of the supporting block and thereby securely held in any position.

If driver 6 is pivoted from its position shown in FIG. 1, spring leaf 3 is pushed away from supporting block 1 and tongues 3' and fork legs 3a and 3b are lifted. In this position, specimens 8 can be inserted or removed.

To bring the supporting block to a definite temperature, it is engaged into a correspondingly heated guide bar 9 which, in the shown example, is designed as a massive base plate with extensions on either side in which guide grooves 10 are provided. In the apparatus, for example, evaporator, in which the specimens are to be subjected to some treatment or examined, the guide bar is firmly connected to a heating or cooling device e.g. tube coils 50 through which a heating or cooling medium is passed by which it is kept at a definite controlled temperature. The problem now is to transfer this temperature to the supporting block 1 and, thereby, to the specimens placed thereon, and the necessary prerequisite therefor is a reliable thermal contact between the guide bar 9 and the supporting block 1.

To obtain a firm contact pressure between the supporting block 1 and the guide bar 9, the following device is provided: A shaft 12 has a driver intermediate its ends comprising a crank or eccentric 14 which is received in a bore 13 of the supporting block 1. In the present example, the driver is a cylindrical portion whose axis is parallel to, but eccentric of, the axis of shaft 12, so that upon rotation of shaft 12, the driver is lifted or lowered. In FIG. 2, eccentric 14 is shown in its upper position. In another bore 16 of supporting block 1, extending perpendicularly to and intersecting with, bore 13, a cylinder 15 is received carrying journals 15' on each end by which it engages in a large diameter groove 10.

Cylinder 15 is the driven member of the eccentric operated device. For this purpose, it is provided with a cross bore 17 having a diameter corresponding to that of shaft 12 and in which eccentric 14 extends; in the position shown in FIG. 2, the eccentric 14 is in its uppermost position and, consequently, supporting block 1 is in its lowermost position. Since the position of the cylinder is determined by the journals 15' applying against the walls of grooves 10 (and, therefore, cannot move farther upwardly), supporting block 1 in the shown position is pressed downwardly against base plate 9 and the desired good thermal contact is established. If, on the contrary, by turning shaft 12, the eccentric is moved from its position shown in FIG. 2 downwardly, the pressure on base plate 9 ceases and supporting block 1 can be displaced in the guide bar or exchanged.

To actuate the device, the shaft 12 may be provided with a handle. In the embodiment of FIG. 1, however, the shaft portion projecting from supporting block 1 is designed as a part of a bayonet fitting or coupling and, for this purpose, carries a cross pin 18 whose ends can engage as pawls of a bayonet coupling corresponding grooves 19 of a mating piece 20. Part 20 forms the end of a manipulator 21 of proper length for displacing the supporting block 1 and, for example, introducing it through narrow openings in the wall of a treatment chamber and engaging it into the guide bar 9.

The other embodiments shown in FIGS. 4-6 are equipped with the same kind of eccentric drive, only guide bar 25 and the contact surface are designed differently, with the same purpose of obtaining a satisfactory thermal contact.

In the embodiment of FIG. 4, a guide bar 25 has a trapozoidal cross section with two side grooves 26 which cooperate with the grooves 27 of supporting block 28. The three substantial parts of the device of FIG. 4 are shown in a perspective view in FIG. 5. In FIG. 4 the section through an intermediate part 52 and the guide bar 25 is taken and the outline 30 of the block 28 is visible.

The part 52 is received in the slot 54 of the block 28 and both these parts are penetrated by the driver shaft 29 having a middle portion designed as an eccentric. The block 28 can be lifted or lowered relative to part 52 by turning the shaft 54. While being lowered, the block 28 is pressed into contact with opposite surfaces of the guide bar 25. The shaft 29 may be actuated in the same way as in the embodiment of FIG. 1, by means of an extension shaft with a bayonet catch, and the holding support 32 for specimens may also be designed as a spring plate in accordance with FIGS. 1, 2, 3.

FIG. 6 shows an embodiment in which a supporting block 41 is shiftable in guide bar 40 and its side surface 42 can be pressed into contact with the opposite surface of the guide bar. For this purpose, a bolt 43 is provided which, on the other side, is pressed into contact with the respective surface of the guide bar by a driver or eccentric 44.

While specific embodiments of the invention have been shown and described in detail to illustrate the application of the principles of the invention, it will be understood that the invention may be embodied otherwise without departing from such principles.

What is claimed:

1. A holding device for electron-microscope specimens comprising a guide bar, means for controlling the temperature of said guide bar, a supporting block associated with said guide bar, support means on said supporting block for supporting a specimen thereon, and means for moving said supporting block and said guide bar relatively to press said supporting block into pressure interengagement with said guide bar to provide a thermal contact therebetween and to permit them to move relatively apart so as to release the pressure interengagement so that one may be disassociated from the other.

2. A holding device according to claim 1 wherein said means for moving said guide bar relative to said supporting block comprises an eccentric driver member disposed therebetween being movable to shift said guide bar in said supporting block relatively.

3. A holding device according to claim 1 wherein said supporting block includes a cavity, said means for moving said guide bar in said supporting block relatively comprising an eccentric disposed in a cavity of said supporting block and having portions journaled in said guide bar so that rotation of said eccentric shift said supporting block relative to said guide bar.

4. A holding device according to claim 1 wherein said guide bar includes a bar member having a groove, said supporting block being movable in said groove, said supporting block having a cavity, an eccentric rotatably mounted in said cavity and having journal portions journaled in said guide bar, rotation of said eccentric being effected to shift said supporting block relative to said guide bar, said eccentric having a further groove therein with an eccentric shaft movable therein for shifting said eccentric member relative to said block to move the journal portion thereof relative to said guide bar.

5. A device according to claim 1 wherein said guide bar includes a receiving recess, said supporting block being engaged in said recess, said supporting block having a cavity therein, a cylinder mounted in said cavity having journal portions extending outwardly on each side of said cavity, said guide bar having receiving recesses into which said journal portions of said cylinder extend and being of a diameter larger than said journal portion to permit shifting movement of said cylinder relative to said supporting block, said cylinder having a bore therethrough, an eccentric shaft extending through said bore and being rotatably journaled in said supporting block being rotatable to cause said eccentric portion to raise said cylinder relative to said supporting block and to affect pressure interengagement of said supporting block to said guide bar through said journal portions, and a drive member connected to said eccentric shaft and by a bayonet joint connection.

6. A holding device according to claim 5 wherein said support means comprises a resilient spring member engaged with the specimen to hold said specimen against said supporting block.

7. A holding device according to claim 6 wherein said holding spring member comprises a resilient leaf having metal tongue portions with forked ends, said specimens comprising a cylindrical member engaged between legs of said forked portions.

* * * * *